United States Patent
Morling et al.

(10) Patent No.: US 6,970,522 B1
(45) Date of Patent: Nov. 29, 2005

(54) DATA RETRIEVAL

(75) Inventors: Robert Philip Morling, Co Dublin (IE); Richard David Barndt, Freemont, CA (US); Christopher Huw Williams, Chepstow (GB)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/551,197

(22) Filed: Apr. 17, 2000

(30) Foreign Application Priority Data

Apr. 16, 1999 (EP) .................................. 99302947

(51) Int. Cl.⁷ ........................ H03D 1/00; H04L 25/34; H03M 13/03; G11B 7/24
(52) U.S. Cl. .................... 375/341; 375/288; 714/794; 369/275.3
(58) Field of Search ............................... 375/340–341, 375/263, 265, 290; 300/14–18, 22, 64, 70; 369/13.01, 13.56, 30.6, 36, 275.3, 86

(56) References Cited

U.S. PATENT DOCUMENTS

| | | | | |
|---|---|---|---|---|
| 4,644,564 A | * | 2/1987 | Dolivo et al. ............... | 375/291 |
| 5,159,610 A | * | 10/1992 | Eyuboglu et al. ........... | 375/290 |
| 5,450,443 A | * | 9/1995 | Siegel et al. ................ | 375/286 |
| 5,537,424 A | * | 7/1996 | Karabed et al. ............ | 714/795 |
| 5,774,504 A | * | 6/1998 | Huszar et al. .............. | 375/341 |
| 5,850,382 A | * | 12/1998 | Koishi et al. ............ | 369/275.3 |
| 5,910,969 A | | 6/1999 | Sayiner et al. | |
| 6,226,332 B1 | * | 5/2001 | Agazzi et al. .............. | 375/288 |
| 6,233,289 B1 | * | 5/2001 | Fredrickson ................ | 375/341 |
| 6,249,544 B1 | * | 6/2001 | Azazzi et al. ............... | 375/233 |
| 6,252,904 B1 | * | 6/2001 | Agazzi et al. .............. | 375/233 |
| 6,253,345 B1 | * | 6/2001 | Agazzi et al. .............. | 714/752 |
| 6,385,255 B1 | * | 5/2002 | McLaughlin et al. ....... | 375/263 |
| 6,426,842 B1 | * | 7/2002 | Kikuchi ..................... | 360/72.2 |

FOREIGN PATENT DOCUMENTS

JP           154943 A    6/1998
WO    WO 95 15551 A    6/1995

OTHER PUBLICATIONS

Fitzpatrick, J. et al, "Partial Response Class I Signaling Applied to High Density Magnetic Recording," Proceedings of the Global Telecommunications Conference, Nov. 29, 1993 (pp. 1950-1954).

"ECMA: 3.81 MM Wide Magnetic Tape Cartridge for Information Interchange-Helical Scan Recording-DDS-3 Format Using 125 M Length Tapes" ECMA-236, Jun. 1996, p. 83.

Siegel, P. et al, "Modulation and Coding for Information Storage," IEEE Communications Magazine, vol. 29, No. 12, Dec., 1991, pp. 68-86.

* cited by examiner

*Primary Examiner*—Amanda T. Le
*Assistant Examiner*—Lawrence B. Williams

(57) ABSTRACT

A digital data storage (DDS) system for reading DDS tapes employs a partial response maximum likelihood detection system which utilises redundancy in the 8-10 DC free modulation encoding to reduce low frequency noise. The system incorporates a time-varying trellis decoder which embodies some of the PR1 rules together with the rules regarding the charge state or the digital sum variation (DSV) implicit in 8-10 modulation coding. The decoder operates to reject low frequency noise such as that caused by crosstalk noise between adjacent tracks on the tape. The trellis topography has been considerably simplified by adopting a two step six state trellis which operates on bit pairs and in which the states relate to the current DSV value, and sign of the previous bit.

26 Claims, 15 Drawing Sheets

Sequence Detector top level

Sequence Detector top level

Half Rate PR1 Viterbi Engine

Basic trellis structure for ASD

|  | metricsIn[0] | metricsIn[1] | metricsIn[2] | metricsIn[3] | metricsIn[4] | metricsIn[5] |
|---|---|---|---|---|---|---|
| acs[0] | metric[0] | metric[1] + dm1 + dm2 | metric[2] + dm2 | | | |
| acs[1] | | metric[1] | metric[2] + dp1 | metric[3] + dm1 + dm2 | metric[4] + dm2 | |
| acs[2] | metric[0] + dp2 | metric[1] + dm1 | metric[2] | | | |
| acs[3] | | | | metric[3] | metric[4] + dp1 | metric[5] + dm2 |
| acs[4] | | metric[1] + dp2 | metric[2] + dp1 + dp2 | metric[3] + dm1 | metric[4] | |
| acs[5] | | | | metric[3] + dp2 | metric[4] + dp1 + dp2 | metric[5] |

|  | select value | | | | | |
|---|---|---|---|---|---|---|
|  | 0 | 1 | 2 | 3 | 4 | 5 |
| trellisOut[0] | [-1,+1] | [+1,+1] | [+1,+1] |  |  |  |
| trellisOut[1] |  | [-1,+1] | [-1,+1] | [+1,+1] | [+1,+1] |  |
| trellisOut[2] | [-1,-1] | [+1,-1] | [+1,-1] |  |  |  |
| trellisOut[3] |  |  |  | [-1,+1] | [-1,+1] | [+1,+1] |
| trellisOut[4] |  | [-1,-1] | [-1,-1] | [1,-1] | [1,-1] |  |
| trellisOut[5] |  |  |  | [-1,-1] | [-1,-1] | [1,-1] |

*Fig. 19*

DATA RETRIEVAL

TECHNICAL FIELD

This invention relates to apparatus and methods for retrieving digital signals from a storage medium and in particular, but not exclusively, to apparatus and methods for retrieving data stored using a DDS data storage system.

BACKGROUND

It is already known to provide reliable storage and retrieval of large amounts of digital data, such as computer data by means of the DDS (Digital Data Storage) format defined in ISO/IEC Standard, 10777:1991 E.

In a DDS read/write mechanism using the format defined in that Standard data are recorded on an elongate recording media, comprising tape coated with a magnetic medium, by a rotating drum carrying one or more electromagnetic heads. The tape is moved by a motor-driven capstan along a path extending between two spools or reels and wrapped partially around the drum. The plane of rotation of the drum is disposed at an angle to the plane of movement of the tape, so that each head traverses the tape along successive tracks extending across the width of the tape at an angle to its centreline, otherwise referred to as helically scanning. The mechanism includes appropriate circuitry for encoding data into signals suitable for recording on tape, including error detection and correction codes, and for conditioning those signals into a form which is optimally matched to the characteristics of the recording media; for data retrieval, additional circuitry is provided for detecting magnetic field variations stored on the tape, deriving corresponding signals, conditioning those signals into a form suitable for subsequent processing, decoding the encoded data, and detecting and correcting errors.

In DDS1 and DDS2, data are recorded at a bit density of approximately 61 kilobits/inch (Kbpi) (equivalent to approximately 24 kilobits/centimeter). At this density a typical DDS tape cartridge can hold up to approximately 8 Gb of data, using the longest practicable tape and techniques such as data compression to maximise the quantity of data the tape can accommodate. In DDS1 and DDS2 devices, the read head is dimensioned so that it reads one bit cell at a time from the tape. The read signal is equalised and in early DDS the equalised channel was a "waveform restoration" or "full response channel" in which the equalised waveform presented to the detector was essentially a replica of the write current waveform. In such systems the detector only needs to decide whether the equalised waveform is greater or less then zero at each bit instant to choose between +1 and −1. The detector may thus comprise a simple threshold detector which employs a slicing technique.

In DDS3 a doubling of bit density was effected and this made it necessary to abandon the simple technique, to achieve reasonable error rates. Attention is directed to WO95/15551, the entire contents of which are incorporated herein by reference, which describes a partial response, maximum likelihood (PRML) detector for retrieving data using a read head which reads two bits at a time. There are various "classes" of partial response; for example a partial response Class I (PR1) duobinary channel applies a (l+D) transform to the input data. Thus the output is a rolling convolution determined by the sum of two input bits. Since the input values are +1, −1, the noiseless outputs are either −2, 0 or +2. It is no longer possible to detect each bit independently because the decisions are recursive, i.e. they depend on previous decisions. This detection and resolution of ambiguities is done by a technique referred to as maximum likelihood sequence detection (MLSD) which may conveniently utilise Viterbi detection. For example, in an ideal noiseless system a sequence of three-level output values 0, 0, 0, −2 is ambiguous until the arrival of the −2 because the initial output values 0 could mean that the pair (+1, −1) or (−1+1) had been received.

Such ambiguities can only be resolved by waiting until a +2 or −2 is received, which will determine whether the previous sequence should run +1, −1, +1, −1, . . . or −1, +1, −1, +1.

The Viterbi detector implements an algorithm which determines the optimum sequence estimation of a finite state process, given a set of noisy observations. The Viterbi algorithm may be described using a trellis diagram which is a time-indexed version of a state diagram.

In the above example, the arrival of the +/−2 means that the trellis branches converge on the same state, thus indicating which of the two alternate candidate paths back through the trellis is most likely; this convergence is referred to as a merge, and the corresponding most likely path is called the survivor path.

In DDS 3, the trellis implements the rules implicit in the partial response and rejects values which violate these rules. For example in a (1+D) convolution, a direct transition between two 2's of opposite sign is not allowed; there must be an odd number of 0's between two 2's of opposite sign and there must be an even number of 0's between two 2's of the same sign. Each node of the PR1 trellis corresponds to a state (i.e. a positive or negative polarisation) at a given time index and each path or branch corresponds to a state transition.

In a Viterbi decoder each path or branch is assigned a weight, referred to as a branch metric, which is a measure of the likelihood of the associated transition, given a noisy observation. The likelihood of a transition is given by a distance measure between the ideal decoder output and the actual received noisy output. Thus the more likely transitions have smaller metrics. For each input the algorithm calculates the branch metrics and recursively computes the lowest metric paths back from time tn to time $t_{n-1}$. In this step the decisions are used recursively to update the survivor path of the signal, using a process known as add-compare-select (ACS) recursion. The shortest branch to each trellis state is then found from the ACS recursion, and this is called the survivor path. The two candidate paths are stored by the Viterbi decoder and updated at each time interval.

The 8-10 encoding process decrees that the number of consecutive 0's may not exceed 14, and this means that a merge will occur within 15 time intervals. This means that the path memory need only accommodate two alternative candidate paths for 15 bits, after which the survivor path (or output) will be available.

One of the benefits of the Viterbi algorithm in relation to PR1 detection is that, at any time point in the trellis, it is necessary to store at the most only two candidate paths and the two metrics associated with these paths. It will be appreciated that otherwise, in a system which has two states and requires twenty consecutive transitions to be stored, the memory would need to have storage capacity for up to 214 paths and an associated metric for each path. Given that in practice the bit rate is of the order of 100 MHz the computation load means that this would be impractical.

As noted above, in DDS3, instead of using a full response, i.e. equalising all frequencies up to the Nyquist frequency at full amplitude, a partial response is used in which the frequency response is equalised to a partial response target. FIG. 1 of the accompanying drawings shows the frequency response of a typical magnetic recording channel before any equalisation is applied. The frequency response of the recording channel is a function of the frequency responses of the write heads, the magnetic recording media, the read heads, the associated electronic circuitry, and the bit density of recording. FIG. 2 shows several popular partial response equalisation targets for different classes of partial response (PR1 (1+D), PR2 (1+$D^2$), PR4 (1-$D^2$), EPR4 ((1-D) (1+D)$^2$) and Dicode (1-D). It will be seen that the PR1 and PR2 targets both have nulls at the Nyquist frequency, the dicode target has a null at DC, whereas the PR4 and EPR4 have nulls at both frequencies. It should be noted that the frequency axis scaling in the Figures is not related. The scaling between the two depends on the bit density and the number of samples/bit which is 1 bit/sample for this discussion.

In the design of a DDS read circuit, it is desirable to match the recording channel frequency response to the partial response target. For low bit densities typified by DDS ½, the bit frequency would be around 20 in FIG. 1, putting the Nyquist frequency at around 10 (indicated by the label "Low Density"). The portion of the channel response between 0 and 10 resembles the dicode target of FIG. 2 and this was an early favourite. Increasing the bit density moves the Nyquist frequency further out and the channel response requires much less noise enhancing equalisation to match targets like PR4 and EPR4.

In practice, in DDS3 the PR1 target was used, in spite of an apparent mismatch at DC, where the PR1 target is at a maximum but the channel response is at a null. The reason for selecting PR1 is that it is important to ensure that the signal written on tape is DC free, because the read and write circuitry employs rotary transformers to transfer the rotary: stationary interface on the rotary head. Accordingly, the data is encoded using a DC free modulation code, and in DDS3 a DC free 8-10 modulation code is used, as set out in ECMA Standard ECMA-236, the entire contents of which are incorporated herein by reference. Because the 8-10 modulation code has a null at DC, the low frequencies may be equalised down lower than they would be for a code without this property. Accordingly, the PR1 channel does not need to pass DC but can be cut off at the lower edge of the code spectrum, avoiding a lot of low frequency noise enhancement but not all of it. In other words, the system may be designed such that the channel frequency response is matched to the combination, or product, of the PR1 target and the frequency response of the 8-10 modulation.

With regard to equalising to a PR4 target, inspection of FIGS. 1 and 2 will show that, as compared with PR4 at the same bit density, equalisation of the channel response to a PR1 target requires more low frequency boost and less high frequency boost. The Applicants have found that the noise in the channel before equalisation tends to increase with frequency and thus targets which avoid boosting at high frequencies are preferred.

The quasi-integration of the signal required to produce PR1 results in amplification of low frequency noise. After equalisation, the resultant coloured noise can be equivalently characterised in the time domain as being positively correlated, meaning that adjacent noise samples are more likely to have the same sign. By contrast, if the channel was equalised to a PR4 target (which has a null at DC) at the same bit density, the noise in the detector would be negatively correlated as a result of high frequency noise enhancement in the equaliser.

In a PR1 Viterbi detector, the received sequence of samples is compared to all possible noisefree sequences (with values +2, 0, and −2) in the recursive method described above. The detector then selects that noisefree sequence which is closest to the noisy samples read from the detector. Two types of minimum distance error have been categorised. In a type 1 error the sign of a single bit is misread, i.e. +1 read as −1 or −1 read as +1. For this type of error to occur, two consecutive noisy samples must differ from their noisefree values by 2; for example for a +1 to be misread as −1, the detected noisy sequence out of the detector differs from the correct sequence by: . . . 0, 0, −2, −2, 0, 0 (the minus signs change to plus signs for a −1 misread as a +1)

This type of error affects the digital sum variation (DSV) which is the rolling sum of the binary digits.

In a type 2 error, the (+1, −1) pair is mistaken for the pair (−1, +1) or vice versa. This occurs when the detector choice is wrong by;—

. . . 0, 0, −2, 2, 0 (the signs reverse where −1, +1 is mistaken for +1, −1)

This type of error does not affect the DSV.

In white noise, both of these types of error are equally likely to occur. However when the noise is positively correlated, (i.e. greater at low frequencies or "Red noise") it is more likely that the noise samples will both have the same sign and therefore in positively correlated noise, errors of the first type tend to predominate. Research by the Applicants has shown that, in a study of DDS3 error events, the first type of error tends to occur more than ten times as often as the second.

Thus, the noise in DDS3 recording is positively correlated and is expected to be even more so in DDS4 recording, where the tracks are closer together and the total system noise becomes more dominated by low frequency, adjacent track cross-talk. Cross-talk noise is predominantly low frequency in DDS3 and 4 as the azimuth angle of the head rejects high frequencies (i.e. short wavelength) from adjacent tracks. Furthermore the Applicants have found that one of the main manufacturing challenges in building DDS or other helical scan mechanisms is preventing variation of the width of the tracks written on tape. If this occurs, some written tracks are narrower than others, which reduces the signal and increases adjacent track cross-talk.

In U.S. Pat. No. 4,888,779 there is disclosed a system for improving coding gain in partial response channels, in which the trellis code spectrum is designed to have nulls at frequencies where the channel transfer function has a null, thereby improving the coding gain and reducing the Viterbi detector complexity. The technique is referred to as "matched spectral null" coding or MSN coding. Thus, according to the above teachings, a PR 1 channel of the type used in DDS systems, and which has a null at the Nyquist frequency, should benefit from a modulation code with a null at the Nyquist frequency. If the noise is white, and a sequence detector matched to the code and channel is used, a gain of 3 dB over uncoded is possible.

U.S. Pat. No. 5,910,969, published after the priority date hereof, describes a system in which a special, dual rate, bipolar code is created which has an overall rate of (k/ql) by mapping a length 'k' binary sequence into an output sequence of 'q' pairs of bipolar words of length 'l'. The coding constraint on the construction of the code words requires that they are composed of sub-words whose overall block digital sum (BDS). The sub-words are selected by an inner rate q/l code, whilst the order of the sub-words is determined by an outer rate p/q code.

Although there are substantial benefits in such a proposal, that are many instances where it is not practical to construct a dual rate code. Also the code has a stringent constraint on the BDS which is required to be zero over k bits.

One such instance where a dual rate code is impractical is in helical tape storage devices such as DDS devices which employ an existing DC-free code such as the 8-10 DC-free code. DC-free codes have the property that the digital sum variation is strictly bounded to some small value. The code used in DDS1 and DDS2 was originally designed for audio digital audio tape (DAT) devices and it was required to be DC-free so that it could be transmitted by a rotary transformer. In these original DDS schemes, the codes have a maximum of three 0's before the next 1 must be transmitted. This was important to reduce the amount of crosstalk between adjacent left and right tracks, and also to have sufficient density of transitions to assist timing recovery.

In DDS3, the use of partial response maximum likelihood was adopted to recover the increased density of recording. A Viterbi detector was added, but the original audio 8-10 code had not been designed with a 1+D Viterbi decoder in mind. In the original unmodified code, it was possible to have an arbitrarily long run of consecutive 0's out of the 1+D channel, which do not guarantee merges in the Viterbi detector. For this reason, approximately 10 code words out of the 256 were changed to limit the number of consecutive 0's to 14, to guarantee a merge within every 14 bits and therefore to reduce the path length memory required to a corresponding number of bits. The DSV of the DDS3 code is 7 (the difference varies from −3 to +3). In order further to increase the storage density, the Applicants wished to designed a system with a reduced track pitch, but without requiring a change in the 8-10 coding previously adopted.

In the matched spectral null coding techniques described in U.S. Pat. No. 4,888,779, the teaching has been to match the frequency response of the modulation code with that of the selected partial response channel. But in DDS2 and DDS3, the signal had been equalised to a PR 1 response, =which does not have a null at DC as would be required by the teachings of U.S. Pat. No. 4,888,779.

It would therefore appear that the 8-10 DC-free codes used in DDS are ill-suited for the types of time-varying trellis decoders described in U.S. Pat. No. 4,888,779, and that the investment in terms of increased complexity in providing a time-varying trellis decoder would not be merited by a substantial improvement in the bit error rate. On detailed investigation however, the Applicants determined that the particular combination of employing a DC-free code and equalising to a partial response target having a substantial response at DC means that the equalisation step boosts low frequencies. This applies for any partial response target having a polynomial factor of (1+0) but no (1−D) factors. A lot of the low frequency noise enhancement is avoided because it can be at the lower end of the DC-free code spectrum, but not all of it. The quasi-integration of the signal required to equalised to a substantial signal at DC still results in amplification of low frequency noise. As noted above the Applicants thus determined that the coloured noise can be equivalently characterised in the time domain as being positively correlated; this means that adjacent noise samples are more likely to have the same sign. In addition, the Applicants realised that, as the track pitch employed on the helical scan system decreases, the proportion of crosstalk increases. Crosstalk noise is predominantly low frequency as the alternative azimuth of the head/track rejects high frequency crosstalk for adjacent tracks.

Accordingly, by far the most common errors are attributed to positively correlated noise. The Applicants used this analysis to design a time-varying trellis which eliminates cross talk which contributes to a long-term increase in the digital sum variation (DSV). Another important factor is that in a 8-10 code e.g. with a DSV of 7, the low number of states greatly eased implementation of a time-varying trellis decoder. It is important to note that the low rate penalty of the 8-10 code has effectively been dictated by and paid for by the unrelated need to pass the current through a rotary transformer. Also, as noted above the dual rate codes of U.S. Pat. No. 5,910,969 are specially selected to have a BDS of 0 at the end of each block of 'k' bits; the DDS 8-10 codes do not have this property as the DSV at the end of each block is merely bounded to be either +1 or −1, and so again the 8-10 codes would not be compatible with a scheme such as that of U.S. Pat. No. 5,910,969.

Without the detailed analysis conducted by the Applicants, the use of a time-varying trellis decoder in a system using a DC-free code in combination with equalising to a target with a full response at DC would appear only to provide marginal improvements in the bit error rate, therefore not appear to be worth the added complexity. However, in practice, the Applicants found that the use of a time-varying trellis to decode data which has been 8-10 encoded, and then equalised to a target with a response at DC such as partial response channels with a (1+D) but no (1-D) factors, may substantially improve the bit error rate by a factor of up to 10 or more.

SUMMARY OF THE INVENTION

By this analysis of the noise characteristics of a typical DDS data recording system, the Applicants have found that the noise in the system is typically positively correlated (predominantly at a low frequency). Previously the decoders such as e.g. the PR1 trellis decoders have made use of the rules implicit in the partial response transform to reduce the error rate. The Applicants have realised that the rules implicit in a DC free code can be used to apply a time-varying trellis matched to the codewords to provide a further robust rejection of a substantial proportion of positively correlated noise, thereby considerably improving the bit error rate. A further significant realisation is that storage devices using DDS3 already use a relatively low code rate (in DDS, 8-10 code modulation is used giving 10 modulation code bits for 8 customer data bits) in order to ensure that the written code is DC free. This low code rate means that the Digital Sum Variation is relatively low (in DDS 8-10 code modulation the DSV is 7, equivalent to a bounded difference in the number of binary +1's and −1's in the range from −3 to +3). The Applicants have discovered that it is possible to make use of the low code rate inherent in the DDS3 and DDS4 systems to considerably reduce the error rate without requiring modification of the format of the write process, and without requiring a change of the equalisation target. Thus a considerable improvement in error rate may be achieved which does not require major changes to the channel architecture.

In one aspect, this invention provides a method for retrieving data from a partial response channel having implicit rules, said data comprising a series of code words encoded from input data using a DC free code having a bounded digital sum variation (DSV), said method comprising:— equalising said data to a partial response target having a substantial DC response;

applying said equalised data to a time-varying trellis decoder designed to reject candidate paths which violate the DSV bounds, and to reject candidate paths which violate the partial response rules, and determining the most likely sequence of data.

Preferably said code is an 8-10 DC free modulation code, for example an 8-10 DC free modulation code as set out in Standard ECMA 236. This code has implicit rules governing the digital sum variation (DSV) which means that legitimate codewords have the property that the DSV at the codeword boundaries must be either +1 or −1 and the DSV within the codeword (i.e. taken at bit positions 2 . . . 8) must lie in the range of from +3 to −3.

Preferably said partial response target has a polynomial function with a (1+D) factor, but without a (1−D) factor. Said partial response target may be a partial response class 1 (PR1) target whose transfer function is of the form (1+D), or it may be a partial response class 2 (PR2) target whose transfer function is of the form $(1+D)^2$.

Preferably said code words are encoded according to a single rate code.

Preferably the DSV is constrained to be either +1 or −1 at the end of each of said code words.

In one arrangement, said data is retrieved from a tape storage medium, and said method includes reading said data from said tape storage medium using a read head arranged to scan the tape helically. Said data may be written on tape in the form of pairs of tracks having magnetisations of alternate azimuth.

Preferably the trellis decoder is time-indexed with the bit positions of the codeword and the states of the trellis preferably relate to the DSV of the codeword at each bit position. More preferably, the states of the trellis relate to the DSV at the relevant bit position and the sign of the previous bit.

In a particularly preferred embodiment, the trellis is a two step trellis, wherein each branch identifies the received sample pairs. By this arrangement a relatively simple trellis rejecting possible sequences which violate the two DSV rules set out above may be constructed which has four states {(+1, +), (+1, −), (−1, +), (−1, −)} at the codeword boundaries, and six states within the codeword {the four states identified above together with (+3, +) and (−3, −)}. Compared to alternative possible trellises implementing the DSV rules of 8-10 encoding this is extremely simple and considerably reduces the computational load and amount of memory required.

Preferably, path memory means are provided for storing candidate paths of data, and at the end of each codeword, the respective candidate paths are stored in memory and assigned a respective address, and the respective address is used during decoding intermediate the codeword boundaries, and the path memory is updated at the end of each new codeword.

In another aspect this invention provides apparatus for retrieving data from a partial response channel having implicit rules, said data comprising a series of code words encoded from input data using a DC free code having a bounded digital sum variation (DSV), said apparatus comprising:— an equaliser for equalising said data to a partial response target having a substantial DC response;

a time-varying trellis decoder for receiving said equalised data and design to reject candidate paths which violate the DSV bounds and to reject candidate paths which violate the partial response rules, and a path length memory for outputting the most likely sequence of data.

By incorporating the DSV rules in conjunction with the rules implicit in the partial response class (e.g. PR1 (1+D), as discussed above, a substantial amount of type 1 noise is rejected by the trellis because it violates the DSV rules, particularly at the codeword boundary. Thus the method provides an error rate improvement over traditional Viterbi detection of PR1 8-10 coded signals by eliminating those errors which contribute to a long term increase in the DSV of the recovered data stream, such as a single +1 being misread as −1 or vice versa.

Whilst the invention has been described above, it extends to any inventive combination of the features set out above or in the following description.

The invention may be performed in various ways, and an embodiment thereof will now be described, by way of example only, reference being made to the accompanying drawings, in which:—

FIG. 19 is a look-up table employed by the trellisOut devices of FIG. 17.

Figure 3:
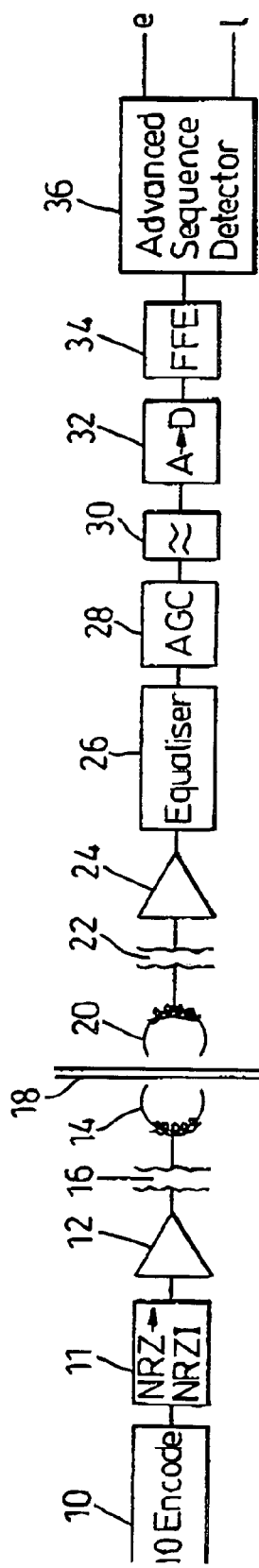
FIG. 3 is a schematic diagram representing the write and read signal paths in a tape storage device in accordance with this invention.

Referring initially to FIG. 3, customer data in non-return to zero or NRZ form data is encoded at 10 using a DC free 8-10 modulation code as set out in ECMA 236 which ensures that the signal is DC free. Prior to actual writing to tape the data are converted at 11 to a transition encoded form (non-return to zero with inversion (NRZI)) in which a binary 1 is represented by a transition from one signal level to another (on tape a transition from magnetization in one sense to magnetization in the opposite sense) and a binary digit 0 is represented by an absence of such a transition. The signal is amplified at 12 and passed to a helically scanned write head 14 via a rotary transformer 16, to write data onto a magnetic tape 18 as a series of oblique overlapping tracks as described in ECMA 236.

Figure 1:
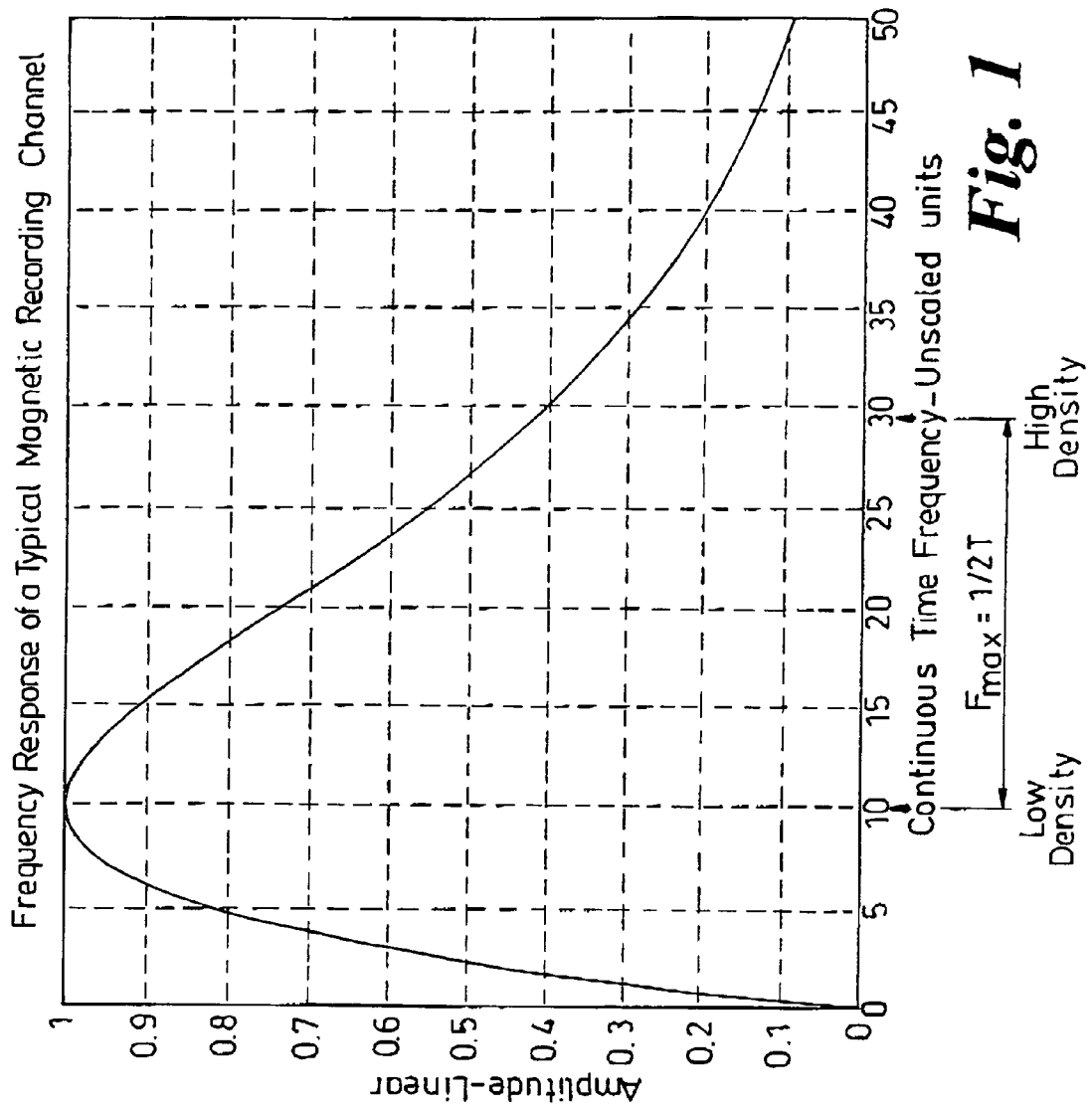
FIG. 1 is a schematic graph of the frequency response of a typical magnetic recording channel.
Figure 2:
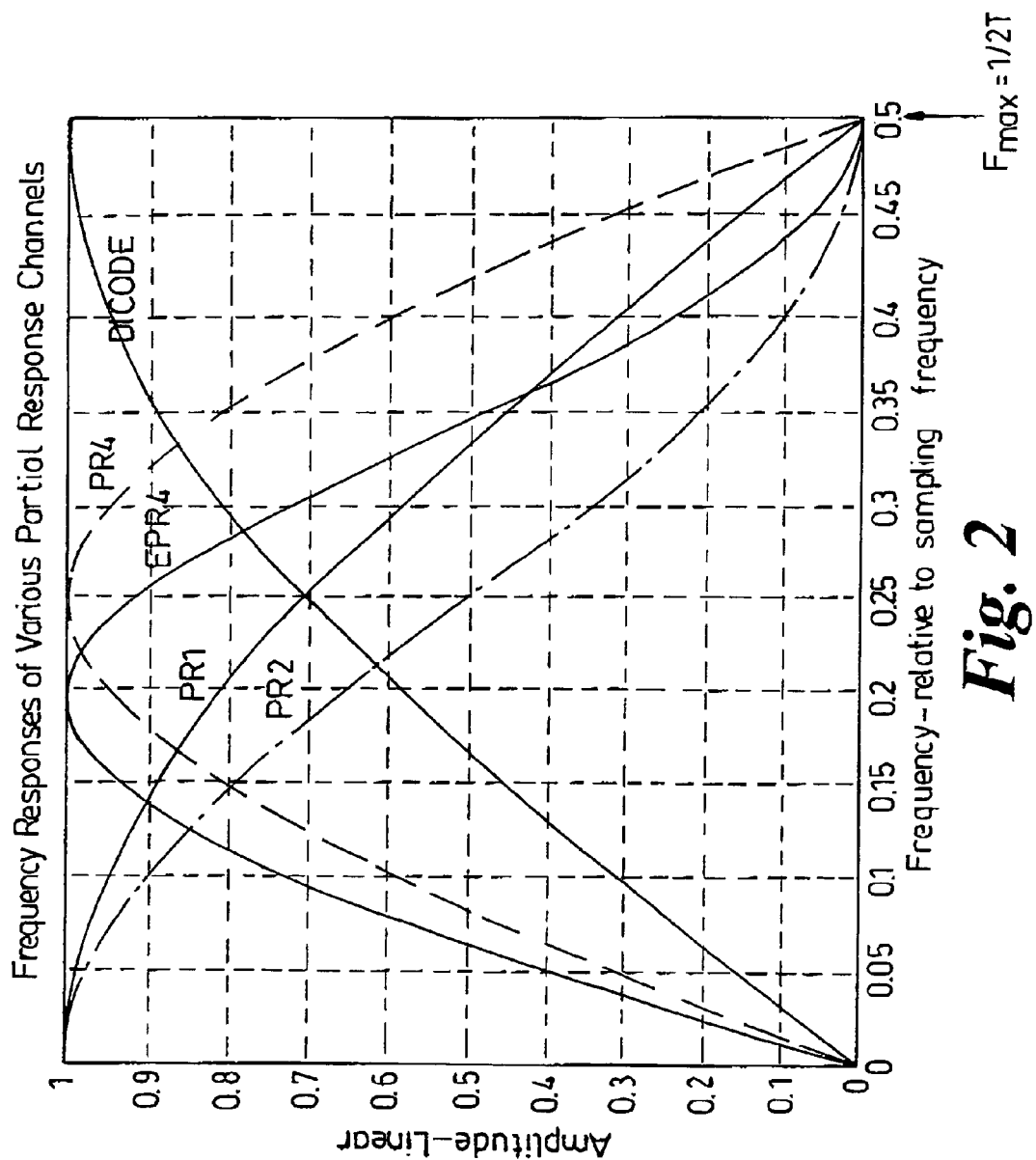
FIG. 2 is a graph showing the frequency responses of various partial response channels.
Figure 4:
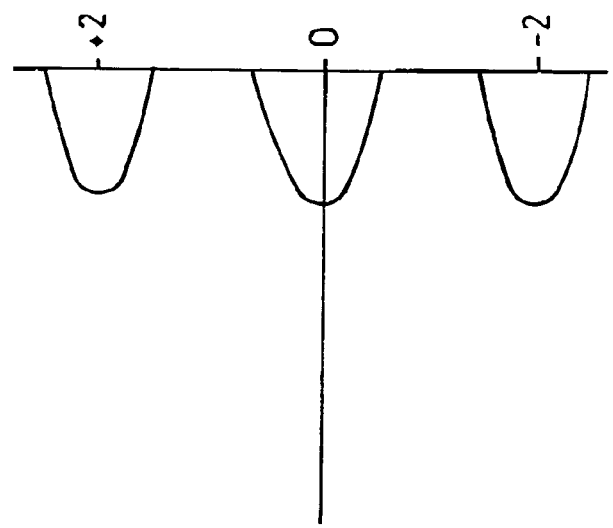
FIG. 4 is a schematic representation of the three-level signal retrieved from tape and supplied to the advanced sequence detector.

Data stored on the tape 18 is read by a read head 20 which passes the signal via a further rotary transformer 22 to an amplifier 24 thence to an equaliser 26 for initial equalisation towards the preferred PR equalisation target shown in FIG. 2. The signal then passes to an automatic gain control (AGC) circuit 28 and thence to a filter 30 which further shapes the overall channel frequency response to match the required PR equalisation target. The filtered signal is then supplied to an analogue to digital converter (ADC) 32, which produces a digitised version of the filtered signal which is then passed to a feed forward equaliser (FFE) 34 which again equalises the signal to the required PR target. The output of the FFE 34 thus comprises the three-level signals (−2, 0, +2) but with noise, so that the amplitude distribution of the signal may be visualised as three Gaussians with peaks at −2, 0 and +2, as shown in FIG. 4.

Figure 5:
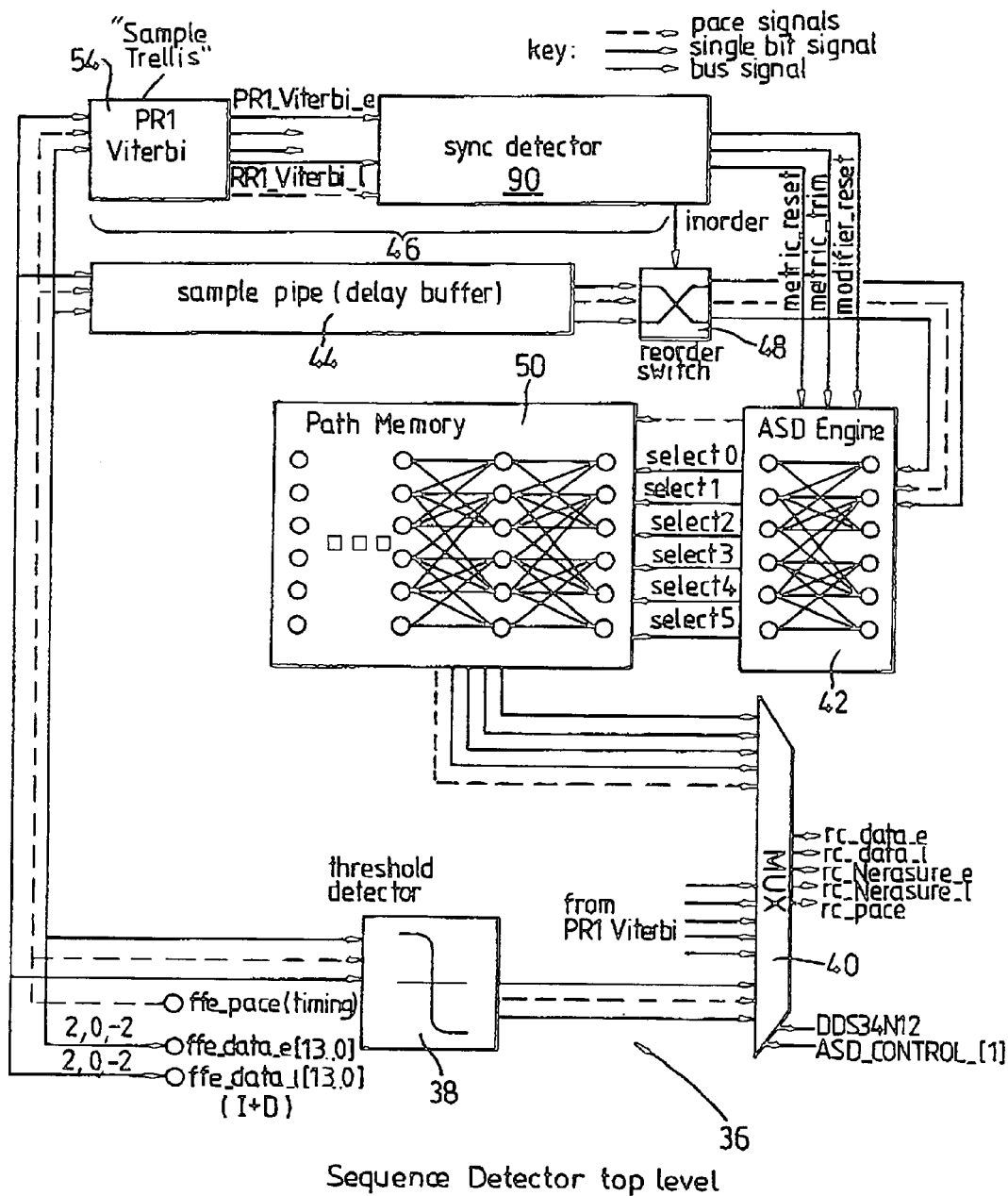
FIG. 5 is a diagram representing the top level structure of an advanced sequence detection apparatus in accordance with this invention for retrieving data, using a PRML process.

The signal in this form is then supplied to an advanced sequence detector 36 in accordance with this invention in the form of alternate three level samples identified respectively as early and late samples ffe_data_e and ffe_data_1. Referring now to FIG. 5, the advanced sequence detector 36 is designed to operate in both DDS ½ and DDS ¾ modes, and there are several possible data paths through the detector 36. In DDS ½ modes only one path is possible, which is through a threshold detector 38 which supplies its output to the output multiplexer 40.

In DDS¾ modes, two paths are possible. The primary path is through a PR1 based ASD engine 42, as to be described in more detail below. Input data samples from the FFE 34 are delayed by a sample pipe delay buffer 44 to allow sufficient time for a sync detector 46 to process the data stream to detect a sync pattern followed by a valid DDS¾ header and then to pass sync signals to a reorder switch 48, and the ASD engine 42. The data samples pass through the ASD engine 42 and to a 200 bit path memory 50 where decisions from the ASD engine 42 cause the shapes of the path through the trellis to form and to tend to converge to a common value.

As a backup solution, the data samples from the FFE 34 can be directed to a PR4 based Viterbi engine (not shown) which also feeds the path memory 50.

Should the ASD engine 42 fail, there is a second data path through a PR1 based Viterbi engine 54, which is provided in the sync detector 46 to produce a binary level (+1, −1) signal for the sync detector 46.

Figure 6:
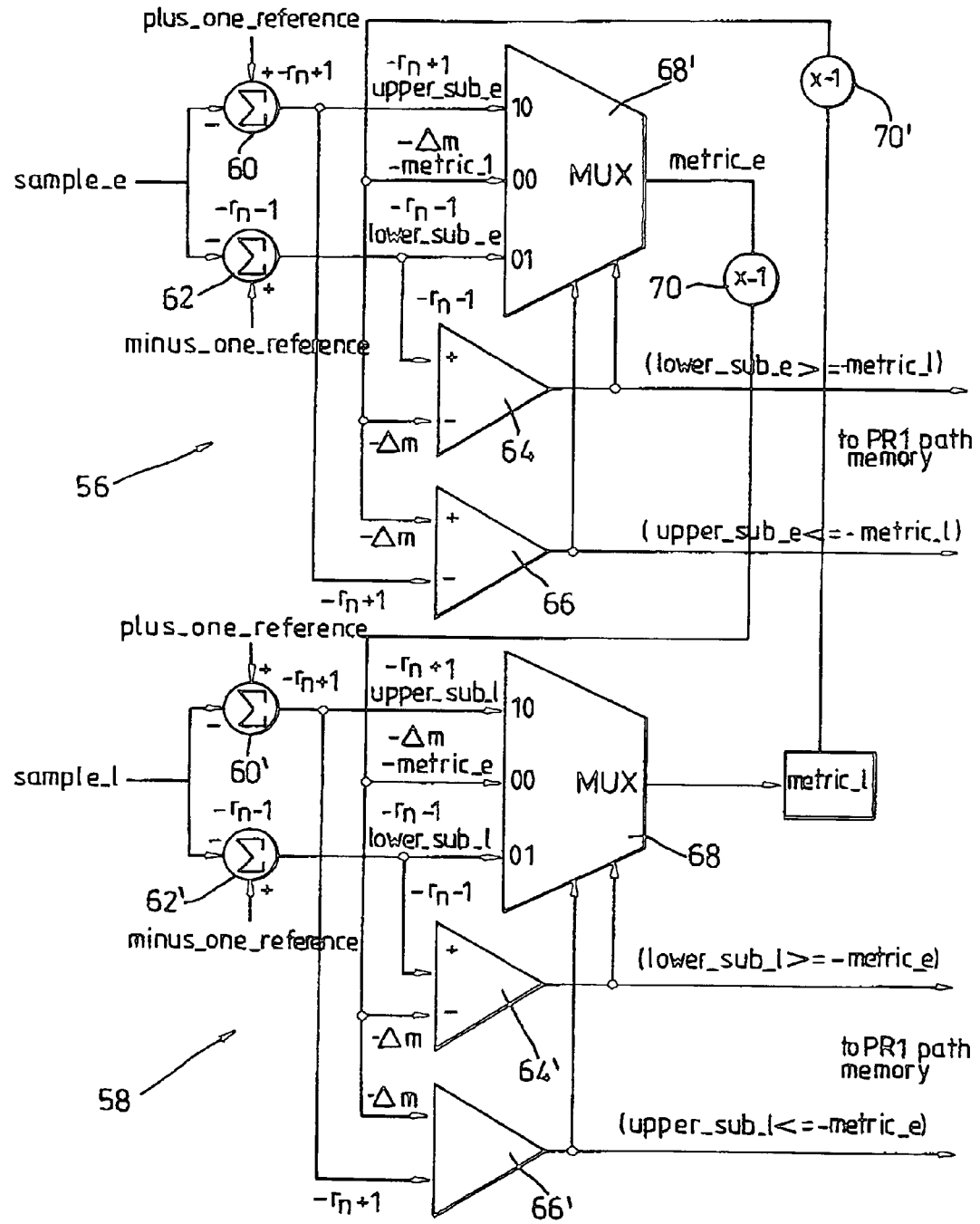
FIG. 6 is a diagram showing the half-rate PR1 Viterbi engine employed in the detection apparatus of FIG. 5.

Referring now to FIG. 6, the PR1 Viterbi engine 54 is shown in more detail. In this example, the clock rate of the detection system operates at half the data rate, and so two engines 56, 58 of similar form process the consecutive samples ffe_data_e and ffe_data_1.

Figure 7:
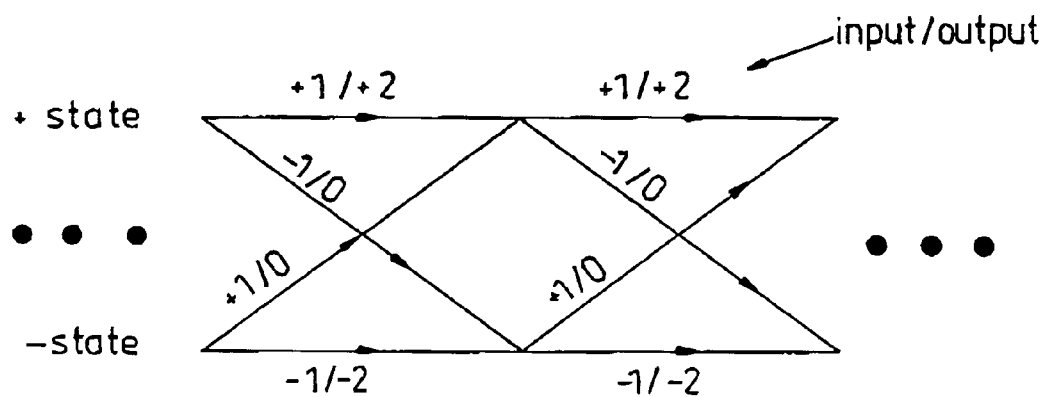
FIG. 7 is a trellis diagram for the PR1 trellis.

FIG. 7 is a PR1 trellis diagram, in which transitions violating the PR1 rules are rejected, and the two states are + and −. There are two legitimate branches or transitions from the +state. The upper one is labelled (+1/+2), indicating that from a +state an input bit of +1 (binary level) would give rise to three-level output of +2. The lower one is labelled (−1/0), indicating that from a +state, an input bit of −1 bit would indicate a three level output of 0.

The legitimate branches or transitions from a − state are (+1/O) and (−1/−2). In conformance with the PR1 rules, the trellis will not allow a sequence which would give an output of +2,0, +2, because any two spaced 2's of the same sign must be separated by an even number of 0's. Likewise two spaced 2's of opposite sign must be spaced by an odd number of 0's.

The Viterbi algorithm may be considered as recursively calculating a metric at each time interval for each of the two available branches from one of the states or nodes; determining the minimum metric to identify the most likely of the two branches back to the previous node; and repeating the same for the other state. At each instant, there are three possibilities; the two branches merge back to the +state, the two paths merge back to the −state, or there is no merge. Once a merge has been detected, a single survivor path back through the trellis from the merge point, representing the most likely sequence of bits can be determined and the other path ignored. This action may be visualised in terms of there being two path memory registers which store respective candidate paths during a sequence of three-level 0's. On occurrence of a merge i.e. arrival of +2 or −2), the survivor path (i.e. the most likely) is written into both registers, overwriting the non-survivor path.

In the algorithm as implemented, instead of determining the metric for both branches back from a node, the difference is determined and stored. This obviates the need for a multiplier, and so the operation reduces to an add, compare and select (ACS) operation.

Figure 8:
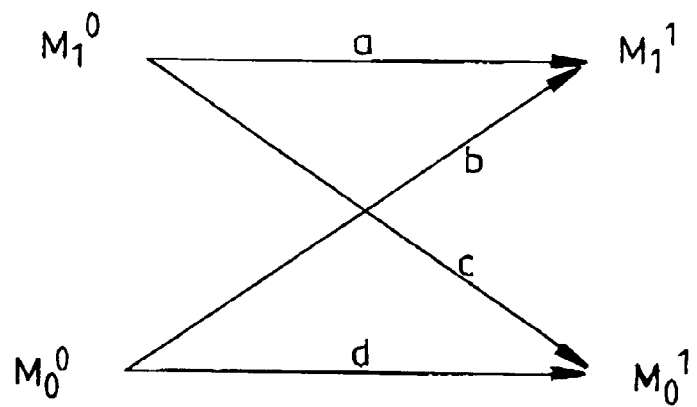
FIG. 8 is a diagram illustrating the various legitimate paths in a cell of a PR1 trellis.

Referring to FIG. 8, the various legitimate paths in a time interval cell of a PR1 trellis are shown. The accumulated metrics for the paths are a, b, c, d, the input value is assumed to be $r_n$, the two accumulated metrics for states + and − at time $t_i$, are $m_o^i$ and $m_1^i$, and the metric difference at time $t_i$, $\Delta m^i$ in $= m_1^i - m_o^i$. In FIG. 8 it can be shown that if a<b and c<d then, $$r_n > \frac{\Delta m^0}{4} + 1$$

and the new metric is:

$$\frac{\Delta m^1}{4} = 1 - r_n$$

These conditions indicate a merge at time 0 at the +state $(M_1^0)$.

If b<a and d<c, it can be shown that:

$$r_n < \frac{\Delta m^0}{4} + 1$$

and the new metric is:

$$\frac{\Delta m^1}{4} = -r_n - 1$$

These conditions indicate a merge at time 0 at the + state ($M^0_0$).

The condition a<b and d<c is impossible.

If b<c and c<d it can be shown that:

$$\frac{\Delta m^0}{4} - 1 < r_n < \frac{\Delta m^0}{4} + 1$$

and the new metric is $\Delta m^2 = -\Delta m^0$. This condition indicates a non-merge.

Accordingly, knowing the sample input $r_n$, and the current metric difference $\Delta m^0$, it is relatively simple to detect whether or not there has been a merge and the appropriate new metric, and for ease of processing the divisor 4 can be ignored.

Referring again to FIG. 6, each of the engines 54, 56 processes the input signal $r_n$ by splitting it and passing it to two adders 60, 62, to produce the values $(-r_n+1)$ and $(-r_n-1)$ respectively which are passed to respective comparators 64, 66 which output a binary 1 if the relevant threshold is exceeded. Thus the output of comparator 64 is 1 if $r_n < \Delta_m^0 - 1$ indicating a merge at the + state, and the output of comparator 66 is 1 if $r_n > \mu m^{0+1}$, indicating a merge at the state. If neither is '1' then there is no merge.

The output from the comparators pass to a PR1 path memory (not shown). The outputs from the comparators 64, 66 are also supplied to a multiplexer 68 to select the appropriate value for the new metric from the inputs $(-r_n+1)$, $(\Delta m^0)$ and $(-r_n-1)$ as described above. The metric is inverted at 70 and supplied to the multiplexer 68' of the other decoder 58'. This functions in the same way, but with the next sample, and the same components are given the same reference numerals supplemented by '.

Thus the PR1 Viterbi detector 54 outputs alternate bits identified as PR1_Viterbi_e and PR1_Viterbi_1 which represent the most likely path through the trellis and thus the most likely signal, which is in NRZI.

Figure 9:
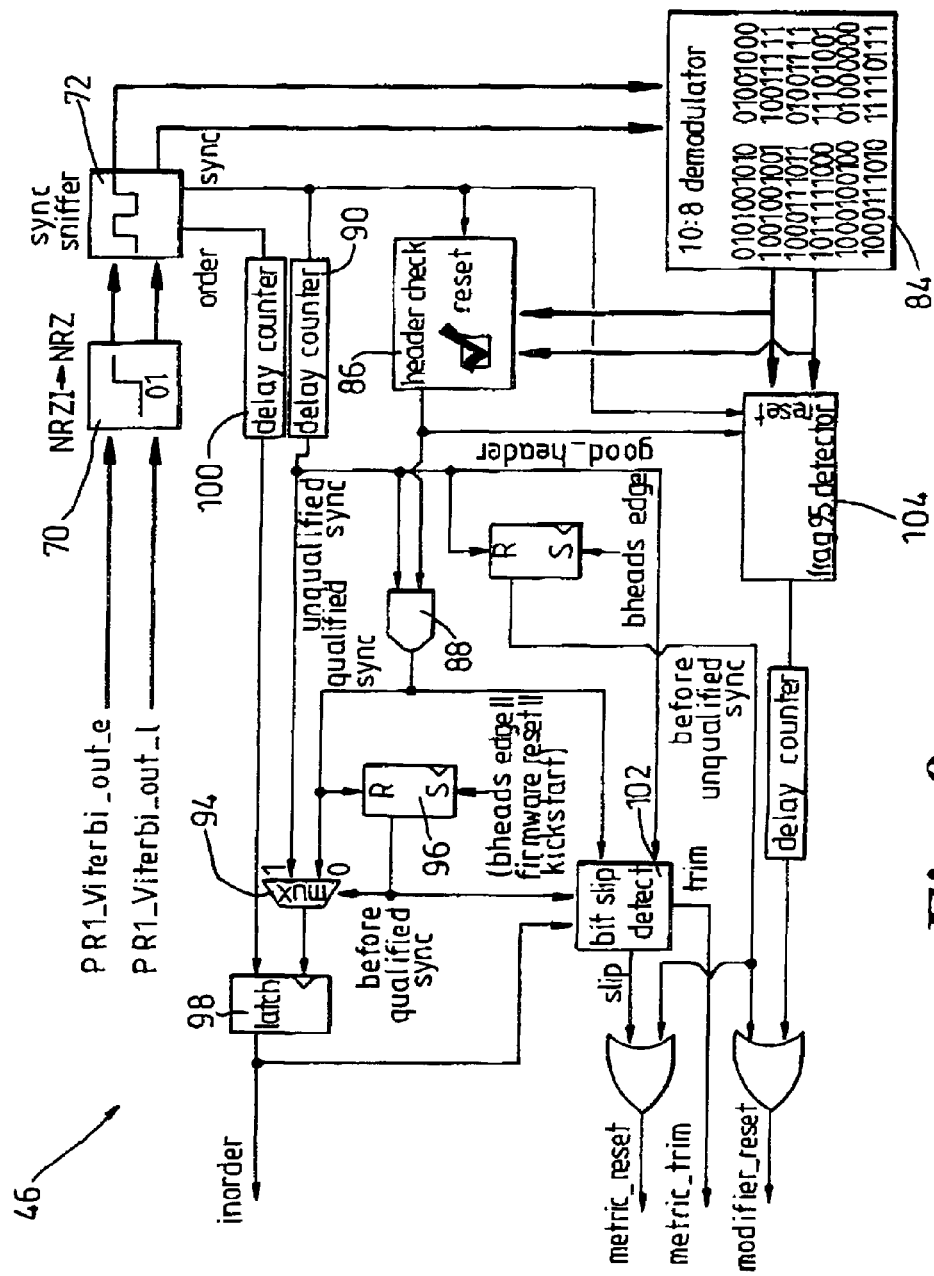
FIG. 9 is a diagram of the sync detector of the advanced sequence detection apparatus of FIG. 5.
Figure 10:
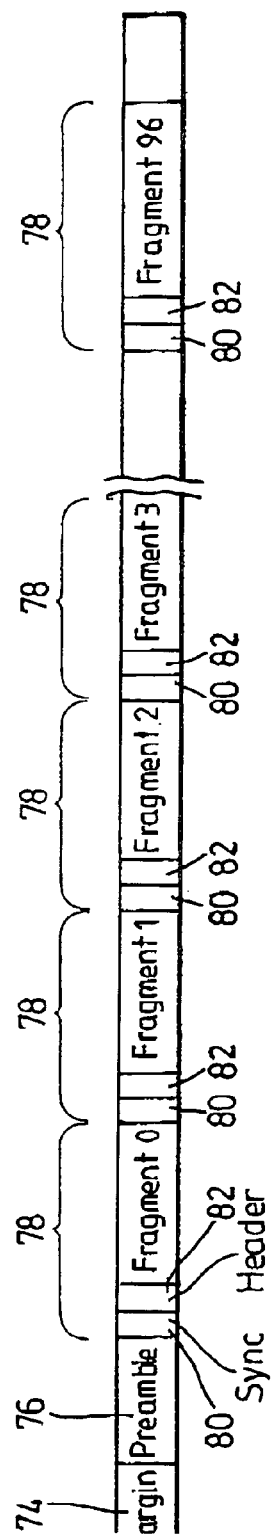
FIG. 10 is a diagrammatic representation of a track in DDS ¾ format.

Referring now to FIG. 9, the output signals from the PR1 Viterbi detector 54 are passed to the sync detector 46. The bits are initially changed from NRZI to NRZ by a transition decoder 70, and the data bit stream is then monitored for a sync pattern by a sync sniffer 72. Referring to FIG. 10, in DDS¾ format, each track consists of a margin 74, a preamble portion 76, and 96 data fragments 78, generally as set out in the ECMA 236 Standard. Each fragment commences with a sync pattern 80 X100010001 (in NRZI) which in NRZ is −1, +1, +1, +1, +1, −1, −1, 1, −1, +1, and is similar to a 4T tone, followed by a fragment header 82, of 8 bytes.

Figure 11:
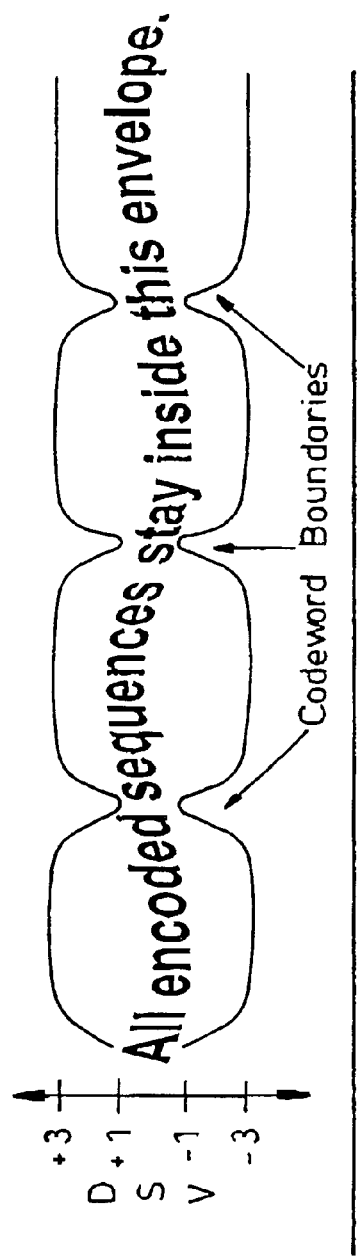
FIG. 11 is a diagram representing the DSV envelope of 10 bit codewords of the 8-10 modulation code employed in DDS 3.

It is important to note that only the data fragments 78 obey the normal 8-10 encoding rules. The operation of the trellis decoder in the advanced sequence detector 42 needs to be aligned with the 10 bit DDS modulation codeword boundaries, because the trellis is configured to make use of the property inherent in 8-10 modulation of the type set out in ECMA 236 that the DSV sits within a prescribed envelope (see FIG. 11) which necks at the codeword boundary. If the operation of the advanced sequence detector 42 is not synchronised with the codeword boundaries, the output is highly likely to be corrupted.

The sync sniffer 72 looks for a sync pattern, but because the probability of a false sync is not sufficiently low, the sync detector 46 qualifies the sync pattern by looking for a good fragment header. Thus the data stream from the sync sniffer 72 is passed to a 10-8 demodulator 84 and then processed by a header check unit 86 to check the parity bytes of the header. However, at the beginning of a track, which may be detected by monitoring the head switching signal from the tape drive mechanism microprocessor, the sync detector 46 will accept any sync pattern, regardless of the header check result, so that the advanced sequence detector can begin working on channel data. If a sync pattern with a good header is found, then subsequent sync patterns which are not followed by valid headers are ignored.

Thus the output of the header check unit 86 passes to an AND gate 88 together with the signal from the sync sniffer 72, indicating whether or not there is a qualified sync signal. A delay counter 90 synchronises the inputs to the AND gate 88, allowing for the delay resulting from the 10-8 demodulation and header check. The output from the AND gate 88 is high when the sync is qualified, and passes to a multiplexer 94 together with the unqualified sync signal. The multiplexer 94 is operated by the output of a flip flop 96 which is set by a firmware reset, or a bheads edge signal, or a kickstart, and reset by a qualified sync pulse from the AND gate 88. The bheads edge signal indicates the drum revolution phase, the firmware reset is a reset of the sequence detector, and the kickstart is a signal from the feed forward equaliser indicating signal drop out. In this implementation two bits are processed at a time and so there are two positions at which the first synch bit can start—bit Pair [1] or bit Pair [2]. The output of the multiplexer 94 clocks a latch 98 which receives from the sync sniffer 72 via a delay counter 100 an "order" signal which indicates which of the two positions at which the sync bit starts. The output of the latch 98 is an "inorder" signal which controls a reorder switch 48 (see FIG. 4) which causes the data to the advanced sequence detector 42 to be reordered when data samples cross a codeword boundary to ensure that pairs fed to the engine always have the first sync bit at the start of a bit pair. While sync pulses have yet to be qualified with a good header, the inorder signal is latched upon qualified syncs from the output of the sync sniffer 72 via the delay counter 100. Once a sync pattern has been qualified, the sync sniffer output is re-set only on subsequent good headers.

A bit slip detect device 102 receives the unqualified sync, the qualified sync, a signal from the flip flop 96 indicating the condition before a qualified sync, and the inorder signal from the latch 98 and detects whether there has been a bit slip. The 10 bits of a codeword are counted using a modulo 5 bit pair counter, and using the in-order signal, which may be thought of as representing one bit of a binary counter. Bits can be added or slipped. A bit slip has occurred if the new sync word is not an integer multiple of 10 bits from the last. If so, the fragment has contained the wrong number of bits and so all the data from the slip until the next sync is lost.

There are two events that cause a bit slip. Firstly, if a new sync pattern is not on a modulo 5 boundary from the last, this indicates that an even number of bits have slipped and so the metrics are reset. Again, the count between unqualified syncs is looked at initially. Once a qualified sync has been found, only subsequent qualified syncs are looked at. Secondly if a new sync pattern is on a modulo 5 boundary but the order has changed from the previous sync, then a bit slip of one has occurred and the metrics are reset. The same strategy of using unqualified syncs is used.

The outputs from the bit slip detect device 102, and the outputs "metric_reset", "metric_trim" and "modifier reset" are carefully synchronised to the data stream. The delay through the sync detector 46 must match the delay through the sample pipe 44, and the reorder switch 48 such that data and corresponding signals arrive at the ASD engine 42 coincidentally.

All syncs except for the first after the start of a track must appear on a modulo 5 boundary. The bit slip device 102 includes a modulo 5 counter and if the counter is any value but zero upon reception of sync, then "slip" is made active to reset the metrics. The first sync after the start of a track can be validated at any time. The bit slip device 102 looks at unqualified syncs at first but switches to qualified syncs once a qualified header is detected, at which time all unqualified syncs are ignored. It also compares the previous value of "inorder" to the new value. If they are different, "slip" is made active to reset the metrics. The output "trim" is active high if the modulo 5 counter equals 1. This output is used by the ASD engine 42 to trim the trellis during a codeword boundary.

The output of the 10-8 demodulator 84 is also passed to a fragment 95 detector 104, which checks the fragment number contained in each fragment header qualified as good by the header check device 86, and provides a high output on detecting a fragment 95 header. The output is reset low at the start of each track and upon receipt of each sync pulse from the sync sniffer 72.

Referring again to FIG. 4, the incoming data ffe_data_e and ffe_data_l passes through the sample pipe 44 and the reorder switch 48 so that the data presented to the advanced sequence detector 42 is in a form such that the bits are correctly partitioned into 10 bit codewords with the bits in the correct order.

The advanced sequence detector 42 incorporates a 6 state, DSV derived trellis which operates on bit pairs, feeding a large path memory 50 of 200 bits in this example, and trellis/metric modifying control circuits. Input bit pairs are assumed to have been correctly aligned with the DDS ¾ modulation codeword boundaries by the re-order switch 48. As the three level input pairs are received a metric corresponding to the squared difference between them and the closest legitimate ideal received pairs is accumulated, taking account of every sequence allowed conforming to the rules of PR1 equalisation, and of the DDS 8-10 modulation code DSV constraint. The sequence with the lowest accumulated metric is chosen. This is done recursively for each allowable state for the relevant bit positions, i.e. 4 states at the codeword boundaries, and six states at each of the remaining even codeword boundaries. Metric (squared error) accumulation is simplified by integrating those parts of the individual squared error terms which are different for each candidate branch.

Figure 12:
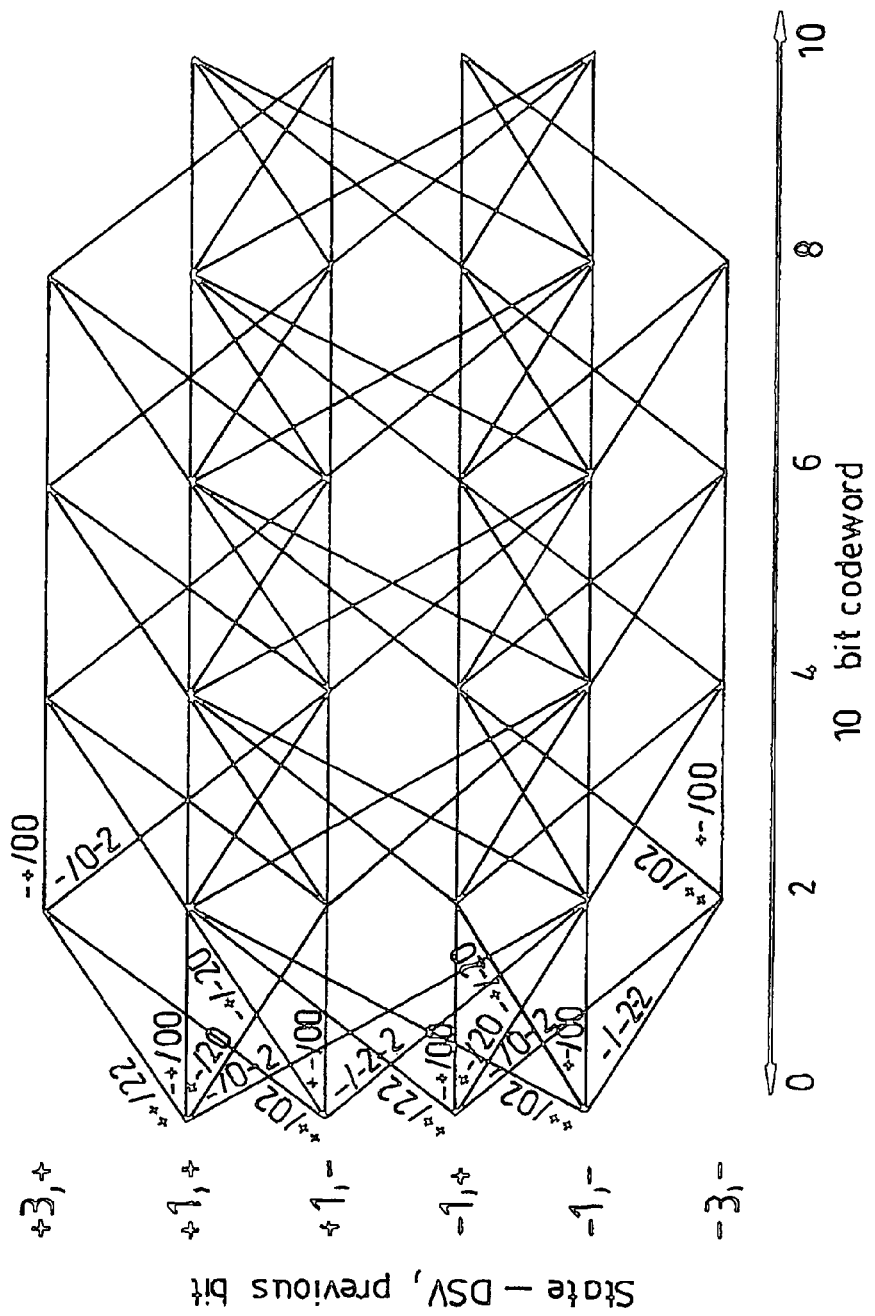
FIG. 12 is a time-varying two step, six state trellis decoder implemented in the advanced sequence detection apparatus of FIG. 5.

FIG. 12 illustrates the two step trellis employed in the advanced sequence detector 42, and the general function of the sequence detector and the path memory 50 will be described, before a more detailed description thereof. As noted above, at the DOS codeword boundaries, the trellis is constrained to four states, namely (+1, +), (+1, −) (−1, +) and (−1, −), where the first value (+1, etc) indicates the current DSV, and the following sign indicates whether the previous binary level input bit was a + or a −. Between the codeword boundaries there are six states, the four previously described and two further states (+3, +) and (−3, −). These latter two states are not valid at the codeword boundaries because the 8-10 modulation code constrains the DSV at the boundaries to +1 or −1. This necking configuration provides an error rate gain in the advanced sequence detector in the presence of low frequency noise.

The path memory length, in this example 200 bits, is selected such that the probability of a merge between the path within the path memory length is highly likely. In this example the selected data sequence at the end of each track is chosen to be that associated with the path memory associated with state (−1, −) (see FIG. 18). If the phase of the synchronisation between the trellis and the 8-10 modulation codeword boundaries changes during a track, this is detected at the sync. detector 46, which outputs a metric-reset signal.

Figure 13:
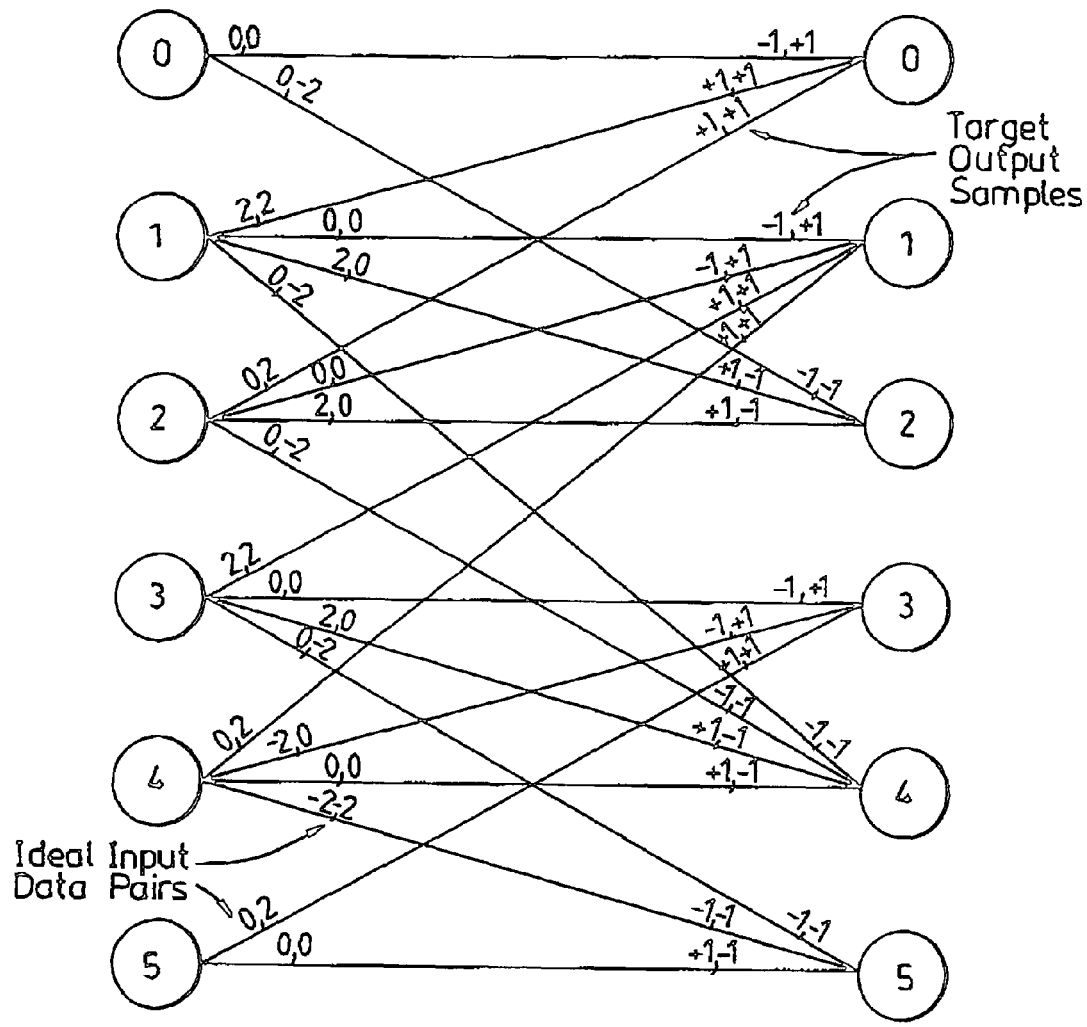
FIG. 13 is a diagram representing the basic trellis cell structure of FIG. 12.
Figure 14:
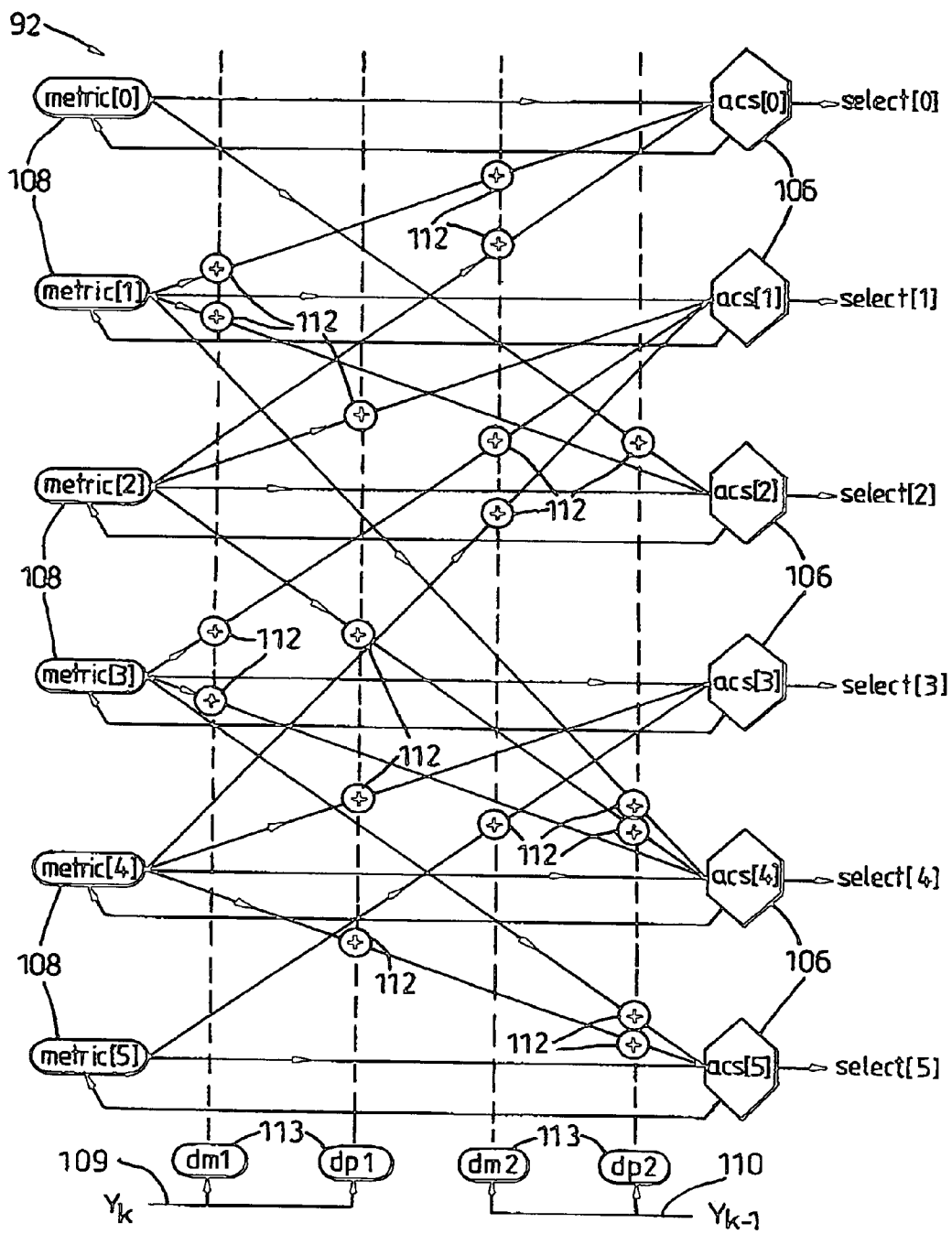
FIG. 14 is a diagram of the ASD engine employed in FIG. 5.

Referring now to FIGS. 13 to 16, the preferred implementation of the sequence detector 42 and the path memory 50 will now be described in more detail. The two step 4/6 state trellis decoder represented in FIG. 12 may be broken down into a number of identical cells of the form illustrated in FIG. 13. As is customary, the diagram shows the legal states and legal transitions, defining the translation of ideal input samples to output values. As input samples are never ideal, the squared error of each state to another is calculated and the least-cumulative error paths are stored. The structure is repeated creating a web of possible paths corresponding to possible data sequences. Referring now to FIG. 14, the decoder is implemented in the form of an ASD engine 42. The engine 42 is made up of six add compare select (ACS) units 106 separately identified as ACS[0] to ACS[5], six associated metric registers 108, separately identified as metric[0] to metric[5]. Successive input binary level input samples corresponding to ffe_data_e and ffe_data_l are input at 109 and 110 and processed by respective path modifier units 113, separately identified as dm1, dp1, dm2 and dp2. The outputs of the path modifier units 109, 110 are supplied to several adder units 112 to be added to various branches or data path vectors indicated by the arrowed lines in FIG. 14, to give the ACS inputs identified in FIG. 15.

Figures 15, 16:
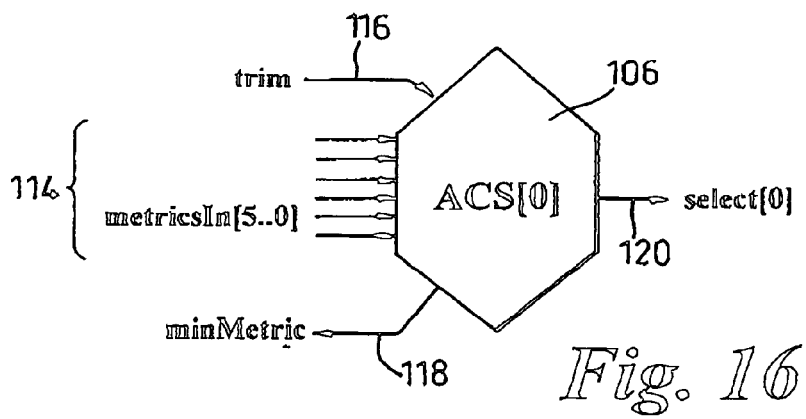
FIG. 15 is a table representing the various inputs to the ACS units shown in FIG. 14.
FIG. 16 is a more detailed diagram of an ACS unit.

Referring to FIG. 16, each ACS unit 106 has six inputs 114 for six metric vectors metrics In [5 . . . 0], and a trim input 116 for receiving a trim signal from the sync detector 46 (FIG. 5). It outputs on 118 a minimum metric vector minMetric and on 120 a select vector identified as select [i]. The ACS unit 106 selects the minimum of the six metric vectors and outputs a select vector which is a number between 0 and 5 which points to the minimum metric. If there are two or more metric vectors with the same value, which are smaller than the rest, the one with the lowest index number will win. It should be noted that all six metrics are never used (inspection of FIGS. 12, 13, and 14 will shows that no node in the trellis receives more than four inputs), but it is important to maintain the order of the blanks (i.e. non-used metrics) and vectors. Blanks are ignored when calculating the minimum. Upon receiving a trim active signal from the sync. detector 46 (indicating the codeword boundary) the inputs from metrics[0] and metric [5] are ignored.

Each metric register 108 is a 12 bit register which holds the current trellis metric values. It is updated with the minimum value from the associated ACS unit 106 each time a sample pair is processed, and it is reset on receipt of a metric-reset signal from the sync. detector 46.

The adder units 112 each receive a 12 bit metric vector from the associated metric register 108, and a metric modifier from the associated path modifier 113 (dm1, dp1, dm2, or dp2) and output the sum thereof to the associated ACS unit 106.

The path modifiers 113 receive the new binary level sample values from the inputs 109, 110 and output the following values:— dm1 = Plus One Ref − Previous Input
dp1 = Previous Input − Minus One Ref
dm2 = Plus One Ref − Current Input
dp2 = Current Input − Minus One Ref Comparing FIGS. 12 and 14, the path modifiers 113 may be considered as modifying the branches between the current metrics 108 and the ACS units 106 so that they determine the metric differences relative to the nominal three-level input signals.

Thus from the node at state +1, + in FIG. 12, there are four possible branches (2,2; 0,0; 2,0; 0, −2) to the next stage of the trellis. Accordingly, in FIG. 14, there are four branches from metric [1]; a branch with +dm1 and +dm2 (corresponding to +2, +2); a branch with no modification (corresponding to 0,0); a branch with +dm1 only (corresponding to 2,0), and a branch with +dp2 only (corresponding to 0, −2).

FIG. 15 is a table showing in equation form the paths and path modifications between the metric registers and the ACS units. Thus, for example, the node at (+1, +) at the eighth bit of a codeword in the trellis of FIG. 12 corresponds to ACS [1] on FIG. 14, and FIG. 15 indicates that this receives four inputs; metric[1], (metric[2]+dp1), (metric[3]+dm1+dm2), and (metric [4] +dm$^2$). At the end of each cycle of the ASD engine illustrated in FIG. 14, each ACS unit 106 outputs a select vector indicating the most likely branch back to the previous node, and the relevant metric is stored in the associated metric register 108.

Figure 17:
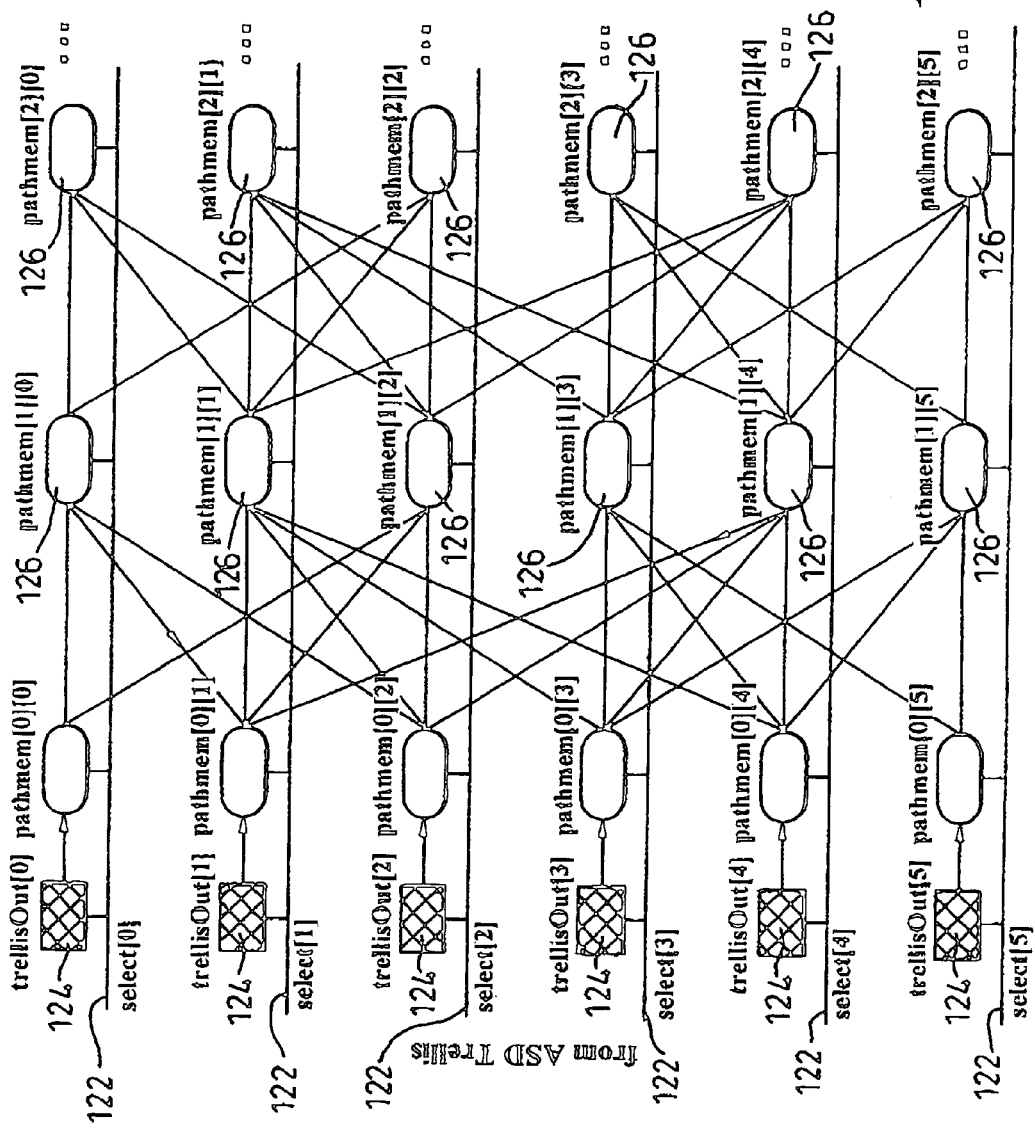
FIGS. 17 and 18 are views of the input and output ends respectively of the path memory used in the advanced sequence detection apparatus of FIG. 5.
Figure 18:
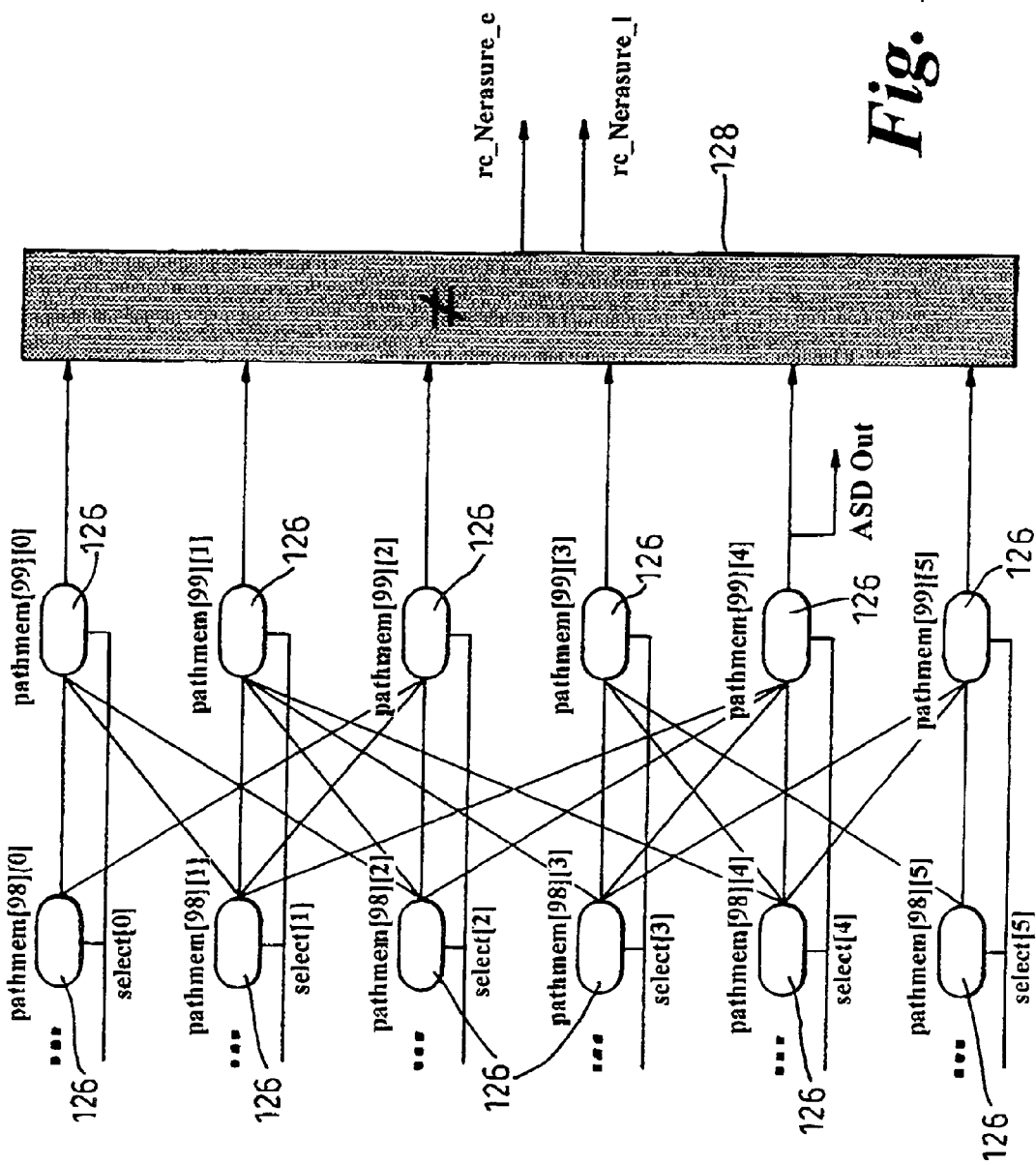

The path memory 50 described below with reference to FIGS. 17 to 19 is designed to handle the path memory structure from the advance sequence detector 42, and also the PR4 path memory output from the PR4 Viterbi detector 52 and is made up of six rows. The path memory comprises six inputs 122 which receive a respective 3 bit select vector from the associated ACS unit 106 from the ASD trellis 42. The 3 bit select vectors on the inputs pass to respective trellis out units 124, each of which comprises a simple look up table as set out in FIG. 19, which corresponds to the relationship between the input samples and the target samples in the ASD engine. The output of the trellis out unit 124 is a 2 bit target sample. For example, if the ACS unit ACS[0] determines that the branch from metric[2] is the most likely (see FIG. 14), the output select[0] of ACS[0] will be 2 (pointing to metric 2). FIG. 19 indicates that a select value of 2 applied to trellis out unit trellisOut[0] indicates the target pair [+1, +1]. Relating this to FIG. 12, if the most likely branch to state (+3, +) at the second bit position is that leading back to state (+1, −), the appropriate select value for that state is [2]; applying the value select [2] to trellisOut[0] in FIG. 18 gives the target pair [+1, +1].

The topology of the remainder of the path memory is the same as that of the ASD trellis unit shown in FIG. 13. The path memory comprises six rows of one hundred 2 bit path memory units 126, the path memory units in each row receiving a respective select signal from the associated ACS unit 106. The outputs of the rows pass to a comparator 128 which indicates if the outputs of the final path memory units in the rows do not agree (indicating that there is no merge).

Each path memory unit 126 receives six pathIn vectors, each of two bits, and a three bit select vector, and outputs a 2 bit target sample. Each unit 126 stores a target value which is seen on the output. For each new sample pushed into the path memory from the trellis out unit 124, a pathIn value is selected and stored.

Accordingly, in operation of the path memory, at each cycle of the ASD engine 42, six select vectors are output, produced by processing the current bit pair. The select vectors are used by the trellis out units 124 to look up the relevant sample pair corresponding to the associated ACS unit 106. This sample pair is stored in the first path memory unit 126 of the row. At the same time, for each row the select vector passes to the remaining path memory units in the row to select and store a sample pair from a specified row. For example if the select[0] vector is 2, the bit pairs stored in the first path memory unit pathMem[0] [0] will be (+1, +1) from the look up table in FIG. 19, and all the remaining path memory units 126 in the row will select and store the respective contents of the previous path memory unit from row 2 of the unit. Thus pathMem[1][0] will select and store the contents of pathMem[0][2], i.e. pathMem [n][0] will store the contents of pathMem[n−1] [2]. At the front end of the path memory, in the absence of a merge, the rows of the path memory will be different. However, on occurrence of a merge of two or more paths, the contents of the path memory are copied to the associated two or more path memory units 126. Thus if select vectors select[0], select[1], select[2] and select[4] are all 2 (select vectors select[3] and select[5] cannot be 2 as this would infringe the rules of the trellis) the trellis out units 124 provide the respective outputs indicated by FIG. 19, and each of the path memory units pathMem[n] [0], pathMem[n][1], pathMem[n][2] pathmem[n][3] and pathMem[n][4] in rows [0], [1], [2], and [4] copy the contents of pathMem[n-1][2] for values n from 1 to 99. At the output end of the path memory it is likely that there will be have been several merges upstream with the result that the path memory units 126 in each column will contain the same bit pairs. The output in this example is taken from row [4].

The advanced sequence detector 42 operates to reject low frequency (i.e. positively correlated) noise where adjacent noise bits tend to have the same sign because the trellis is constructed to correspond to the necking of the DSV at the codeword boundaries. Noisy paths through the trellis will tend eventually to conflict with the DSV rules at the codeword boundary and thus not cross codeword boundaries. Taking into account the typical noise in a DDS 3 or 4 readback waveform, the advanced sequence detector has been found to reduce the error rate by a factor of 10 over the reduction achieved by the DDS3 detection method.

In the above embodiment, the path memory stores all six paths. However the chip area required for the trellis detector is dominated by the path memory requirements which could be significantly reduced, by up to nearly one third, by using a modified algorithm. Because of the necked structure of the trellis, at the boundary of each codeword, there are only four states and thus only four paths need to be stored in the detector path memory. However of course within each codeword away from the boundaries there are six states. Therefore by providing slightly more processing at each codeword boundary during the detection process each of the four paths is frozen in memory and labelled with a two bit address until the start of the next codeword. This 2 bit address or label is the virtual tail of all branches that extend forward from the respective one of the four codeword boundary states. As the current codeword is detected, each of the six states inherits from its predecessor state the preceding estimated bit pairs back to the immediately previous codeword boundary together with the two bit virtual tail.

When the next codeword boundary is reached, a new set of four paths is stored by replacing the virtual path (i.e. the 2 bit address) inherited by each state, with the most recent 190 bits (i.e. the path length memory less one codeword) from the associated path memory. This is appended to the 10 bits of recent path memory inherited by each state, and the process continues for each detected codeword.

The output data may be obtained by reading the oldest bits of one of the four paths sequentially i.e. up to one codeword, or taken in parallel as a whole codeword at each codeword boundary. In the latter case there is a slight loss in effective path memory length (less than 1 codeword because the path memory updates are delayed until the next codeword boundary.

What is claimed is:

1. A method of retrieving data from a partial response channel having implicit rules, said data having been read from a helical scan magnetic tape storage medium that stores said data in tracks having alternate azimuth magnetizations, the data read from the tracks having alternate azimuth magnetizations having a predominate crosstalk noise component at a relatively low frequency compared to the frequency of the read data, said stored and read data comprising a series of codewords encoded from input data using a DC-free code, each of said codewords having a digital sum variation (DSV) bounded within a first preset range at the codeword boundary, said method comprising:

equalizing said data to a partial response target having a substantial DC response; and reducing by a substantial amount the predominate low frequency noise component from the equalized data by applying a set of equalized data to a time-varying trellis decoder that rejects candidate paths that violate (a) the DSV bounds and (b) the partial response rules.

2. The method of claim 1, further including determining the most likely sequence of data in the equalized data with the reduced low frequency noise component by responding to an output of the decoder, the decoder output including the equalized data with The reduced low frequency noise component.

3. The method of claim 1, further including reading said data from said tape storage medium by using a read head that scans the tape helically and reads said data from pairs of tracks having alternate azimuth magnetizations.

4. A method according to claim 1, wherein said code is an 8-10 DC free modulation code.

5. A method according to claim 1, wherein said code is an 8-10 DC free modulation code as set out in standard ECMA 236.

6. A method according to claim 1, wherein said partial response target has a polynomial function with a (1+D) factor.

7. A method according to claim 6, wherein said polynomial function does not have a (1-D) factor.

8. A method according to claim 1, wherein said partial response target is a partial response class 1 (PR1) target whose transfer function is of the form (1+D).

9. A method according to claim 1, wherein said partial response target is a partial response class 2 (PR2) target whose transfer function is of the form $(1+D^2)$.

10. A method according to claim 1, wherein said code words are encoded according to a single rate code.

11. A method according to claim 1, wherein the DSV is constrained to be either +1 or −1 at the end of each of said code words.

12. A method according to claim 1, wherein said trellis decoder is a two step decoder operating on bit pairs.

13. A method according to claim 1, wherein the nodes of the trellis decoder represent the DSV, and the sign of the previous bit.

14. A method according to claim 1, wherein said DC free modulation code is that specified in ECMA 236, and said trellis decoder has four states at the codeword boundaries and six states for each bit pair intermediate the codeword boundaries.

15. A method according to claim 1, including a path memory for storing candidate paths of data, wherein, at the completion of each codeword, the respective candidate paths are stored in the path memory and assigned a respective address, and the respective address is used during decoding intermediate the codeword boundaries, and the path memory is updated at the completion of each new codeword.

16. Apparatus for retrieving data from a partial response channel having implicit rules, said data having been read from a helical scan magnetic tape storage medium that stores said data in tracks having alternate azimuth magnetizations, the data read from the tracks having alternate azimuth magnetizations having a predominate crosstalk noise component at a relatively low frequency compared to the frequency of the read data, said stored and read data comprising a series of codewords encoded from input data using a DC-free code, each of said codewords having a digital sum variation (DSV) bounded within a first preset range at the codeword boundary, the apparatus comprising:

an equalizer for equalizing said data to a partial response target having a substantial DC response;

a time-varying trellis decoder for receiving a set of equalized data and for rejecting candidate paths which violate (a) the DSV bounds and (b) the partial response rules, thereby substantially reducing a low frequency noise component in said data; and a path length memory for receiving the data with the reduced low frequency noise component, as derived by the decoder, for outputting the most likely data sequence.

17. The apparatus of claim 16, further including a transducer for reading data from the helical scan magnetic tape storage tracks having alternate azimuth magnetizations.

18. The apparatus of claim 16, wherein said trellis decoder is a two-step decoder arranged to operate on bit pairs.

19. The apparatus of claim 16, wherein said path memory is adapted to store candidate paths of data, the path memory being arranged to store, at the completion of each codeword, the respective candidate paths at assigned addresses for the candidate paths, the path memory being arranged so (a) the addresses are used during decoding intermediate the codeword boundaries, and (b) the path memory is updated at the completion of each new codeword.

20. A trellis decoding arrangement for decoding a codeword comprising:

a multi-state time varying trellis arranged to have a reduced number of states toward the completion of each codeword, the trellis including a path memory for storing candidate paths and data, wherein the trellis is arranged such that:

(a) at the completion of each codeword the respective candidate paths are stored in the path memory at respective assigned addresses for the candidate paths, (b) the respective address is used during decoding of the codeword intermediate the codeword boundaries, and (c) the path memory is updated at the completion of each new codeword.

21. The trellis decoding arrangement of claim 20, wherein the codeword is derived from data retrieved from a partial response channel having implicit rules, said data having been read from a helical scan magnetic tape storage medium that stores said data in tracks having alternate azimuth magnetizations, the data read from the tracks having alternate azimuth magnetizations having a predominate crosstalk noise component at a relatively low frequency compared to the frequency of the read data, said stored and read data comprising a series of codewords encoded from input data using a DC-free code, each of said codewords having a digital sum variation (DSV) bounded within a first preset range at the codewords boundary.

22. The trellis decoding arrangement of claim 21, further including a transducer for reading data from the helical scan magnetic tape storage tracks having alternate azimuth magnetizations.

23. A method of decoding a codeword by using a multi-state time varying trellis having a path memory, the method comprising:
  causing the trellis to have a reduced number of states toward the completion of each codeword;
  at the completion of each codeword storing the respective candidate paths in the path memory at respective assigned addresses for the candidate paths;
  using the respective address during decoding of the codeword intermediate the codeword boundaries; and
  updating the path memory at the completion of each new codeword.

24. The method of claim 23, further including retrieving data from a partial response channel having implicit rules, said data having been read from a helical scan magnetic tape storage medium that stores said data in tracks having alternate azimuth magnetizations, the data read from the tracks having alternate azimuth magnetizations having a predominate crosstalk noise component at a relatively low frequency compared to the frequency of the read data, said stored and read data comprising a series of codewords encoded from input data using a DC-free code, each of said codewords having a digital sum variation (DSV) bounded within a first preset range at the codewords boundary.

25. The method of claim 24, further including reading said data from said tape storage medium by using a read head that scans the tape helically and reads said data from pairs of tracks having alternate azimuth magnetizations.

26. Apparatus for performing the steps of claim 23.

* * * * *